US009170331B2

(12) United States Patent
Aimin (10) Patent No.: US 9,170,331 B2
(45) Date of Patent: Oct. 27, 2015

(54) OBJECT MODELING

(75) Inventor: Su Aimin, Shanghai (CN)

(73) Assignee: Empire Technology Development LLC, Wilmington, DE (US)

( * ) Notice: Subject to any disclaimer, the term of this patent is extended or adjusted under 35 U.S.C. 154(b) by 432 days.

(21) Appl. No.: 13/260,753

(22) PCT Filed: Oct. 11, 2010

(86) PCT No.: PCT/CN2010/077644
§ 371 (c)(1),
(2), (4) Date: Apr. 11, 2012

(87) PCT Pub. No.: WO2012/048456
PCT Pub. Date: Apr. 19, 2012

(65) Prior Publication Data
US 2012/0265495 A1  Oct. 18, 2012

(51) Int. Cl.
*G06F 17/50* (2006.01)
*G01S 17/02* (2006.01)
*G01S 17/08* (2006.01)
(Continued)

(52) U.S. Cl.
CPC .............. *G01S 17/023* (2013.01); *G01S 17/08* (2013.01); *G01S 17/89* (2013.01); *G01S 19/51* (2013.01); *G06F 17/5004* (2013.01)

(58) Field of Classification Search
CPC ....... G01S 17/023; G01S 17/08; G01S 17/89; G01S 19/51; G06F 17/5004
USPC ........................ 703/1; 382/100; 701/514–527; 701/300–302; 702/94, 95, 150–159
See application file for complete search history.

(56) References Cited

U.S. PATENT DOCUMENTS 6,781,683 B2   8/2004   Kacyra et al.
6,917,893 B2   7/2005   Dietsch et al.
(Continued)

FOREIGN PATENT DOCUMENTS

CN   101290222 A   10/2008
CN   101290725 A   10/2008
JP   2012510064 A   4/2012

OTHER PUBLICATIONS

Amidi, Omead et al., "Vision-Based Autonomous Helicopter Research at Carnegie Mellon Robotics Institute 1991-1997", 1998.*
(Continued)

*Primary Examiner* — Kamini S Shah
*Assistant Examiner* — Cedric D Johnson
(74) *Attorney, Agent, or Firm* — Moritt Hock & Hamroff LLP; Steven S. Rubin, Esq.

(57) ABSTRACT

Technologies are generally described for a system and method effective to generate a model of a first object. In some examples, the method includes receiving location data relating to a location of a second object and orientation data relating to an orientation and rotational movement of the second object. In some examples, the method includes calculating line of sight data relating to a line of sight of a laser rangefinder in the second object. In some examples, the method includes receiving distance data relating to a distance between the second object and at least one point on the first object. In some examples, the method includes calculating an image data point relating to the first object, the image data point may be based on the location data, the line of sight data, and the distance data. In some examples, the model may be based on the image data point.

21 Claims, 5 Drawing Sheets

(51) Int. Cl.
*G01S 17/89* (2006.01)
*G01S 19/51* (2010.01)

(56) References Cited

U.S. PATENT DOCUMENTS

| | | |
|---|---|---|
| 2008/0239288 A1 | 10/2008 | Lee et al. |
| 2008/0262721 A1 | 10/2008 | Guo et al. |
| 2009/0021750 A1 | 1/2009 | Korner et al. |
| 2009/0262974 A1* | 10/2009 | Lithopoulos .................. 382/100 |
| 2010/0026809 A1* | 2/2010 | Curry ............................ 348/157 |
| 2011/0010129 A1* | 1/2011 | Kirby ............................ 702/153 |
| 2011/0231094 A1* | 9/2011 | Simon ........................... 701/213 |

OTHER PUBLICATIONS

Frueh, Christian et al., "Data Processing Algorithms for Generating Textured 3D Building Facade Meshes from Laser Scans and Camera Images", 2005, International Journal of Computer Vision 61 (2), Springer Science + Business Media, Inc.*

Hong, Seungpyo et al., "Acquiring a Physical World and Serving Its Mirror World Simultaneously", 2009, Springer-Verlag.*

"Inertial Measurement Unit" retrieved from Wikipedia on Nov. 17, 2011.

PCT International Search Report PCT/ISA/210 for PCT/CN2010/077644 dated Jul. 21, 2011.

PCT Written Opinion of the International Searching Authority for PCT/CN2010/077644 dated Jul. 21, 2011.

"3D Scanner" retrieved from Wikipedia on Aug. 4, 2010.

Feng, Y. et al., "Research on Three Dimensional City Model Reconstruction Based on Airborne LIDAR", Geomatics & Spatial Information Technology, Aug. 2008, p. 8-11, vol. 31, No. 4, (English Abstract).

* cited by examiner

OBJECT MODELING

CROSS REFERENCE TO RELATED APPLICATION

This application is a U.S. National Stage filing under 35 U.S.C. §371 of International Application No. PCT/CN2010/077644 filed Oct. 11, 2010, the entirety of which is hereby incorporated by reference.

BACKGROUND

Unless otherwise indicated herein, the materials described in this section are not prior art to the claims in this application and are not admitted to be prior art by inclusion in this section.

In modeling systems, a scanning device can be configured to scan a real world object and detect image data relating to the object. The image data may be used by a processor to construct a digital model of the object. The model can be used as a virtual representation of the real world object.

SUMMARY

In an example, a method for generating a model of a first object is described. In some examples, the method includes receiving, at a processor, location data relating to a location of a second object. In some examples, the method includes receiving, at the processor, orientation data. In some examples, the orientation data relates to an orientation of the second object and the orientation data relates to a rotational movement of the second object. In some examples, the method includes calculating, by the processor, line of sight data. In some examples, the line of sight data relates to a line of sight of a laser rangefinder disposed in the second object. In some examples, the line of sight data is based on the orientation data. In some examples, the method includes receiving, at the processor, distance data relating to a distance between the second object and at least one point on the first object. In some examples, the method includes calculating, by the processor, an image data point relating to the first object. In some examples, the image data point is based on the location data, the line of sight data, and the distance data. In some examples, the method includes generating, by the processor, the model based on the image data point.

In an example, a system effective to generate a model of a first object is described. In some examples, the system includes a second object and a processor. In some examples, the second object is effective to calculate location data relating to a location of the second object. In some examples, the second object is effective to calculate orientation data relating to an orientation of the second object. In some examples, the orientation data relates to a rotational movement of the second object. In some examples, the second object is effective to calculate distance data relating to a distance between the second object and at least one point on the first object. In some examples, the processor is effective to receive the location data, the orientation data, and the distance data. In some examples, the processor is effective to calculate line of site data relating to a line of sight of a laser rangefinder disposed in the second object. In some examples, the line of sight data is based on the orientation data. In some examples, the processor is effective to calculate an image data point of the first object based on the location data, the line of sight data, and the distance data. In some examples, the processor is effective to generate the model based on the image data point.

In an example, a first object effective to calculate image data relating to a second object is described. In some examples, the first object includes a global positioning system module. In some examples, the global positioning system module is effective to calculate location data relating to a location of the first object. In some examples, the first object includes a laser rangefinder. In some examples, the laser rangefinder is effective to calculate distance data relating to a distance between the first object and at least one point on the second object. In some examples, the first object includes an accelerometer. In some examples, the accelerometer is effective to calculate orientation data relating to an orientation of the first object. In some examples, the orientation data is related to a line of sight of the laser rangefinder and a rotational movement of the first object. In some examples, the first object includes a memory in communication with the global positioning system module, the laser rangefinder, and the accelerometer. In some examples, the memory is effective to receive and store the location data, the distance data, and the orientation data.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

all arranged according to at least some embodiments described herein.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

This disclosure is generally drawn, inter alia, to methods, apparatus, systems, devices, and computer program products related to object modeling.

Briefly stated, technologies are generally described for a system and method effective to generate a model of a first object. In some examples, the method includes receiving location data relating to a location of a second object and orientation data relating to an orientation and rotational movement of the second object. In some examples, the method includes calculating line of sight data relating to a line of sight of a laser rangefinder in the second object. In some examples, the method includes receiving distance data relating to a distance between the second object and at least one point on the first object. In some examples, the method includes calculating an image data point relating to the first object, the image data point may be based on the location data, the line of sight data, and the distance data. In some examples, the model may be based on the image data point.

Figure 1:
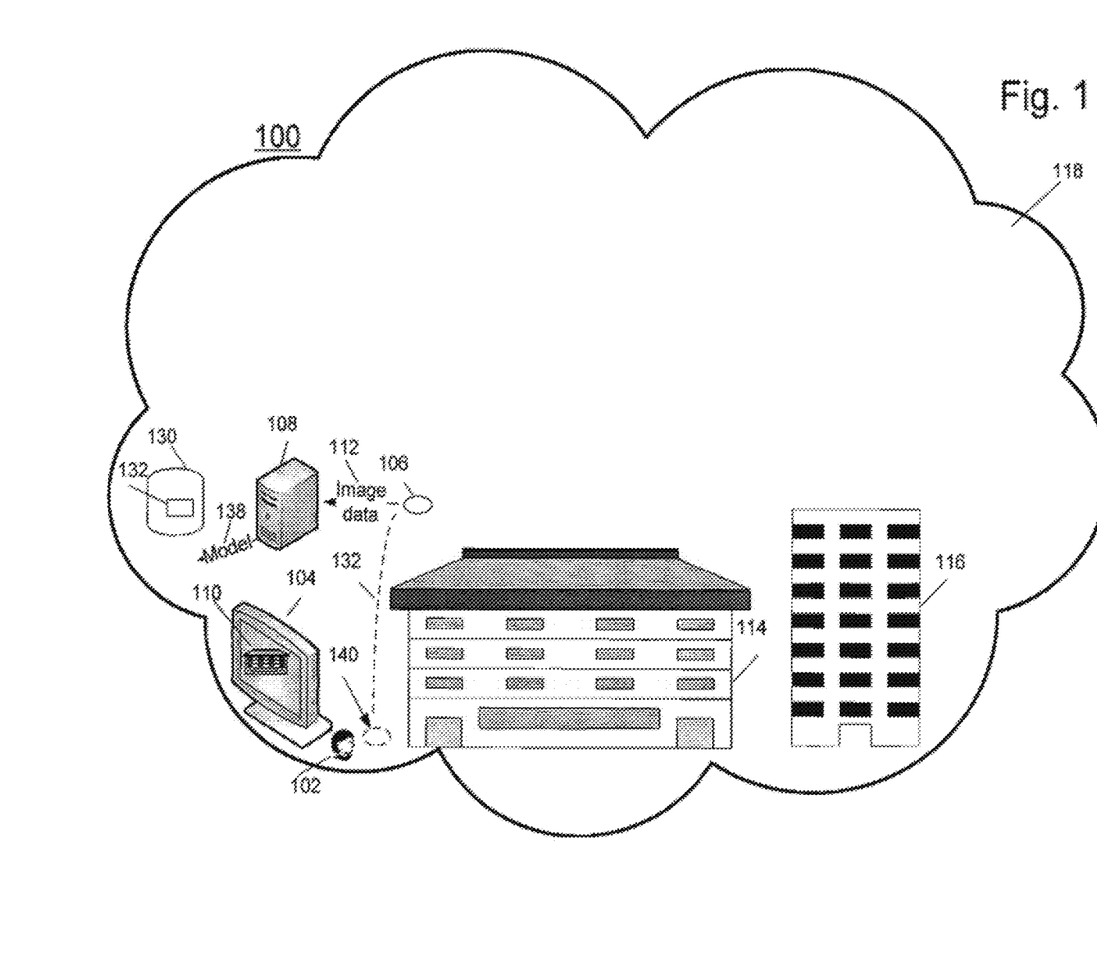
FIG. 1 illustrates some example systems that can be utilized to implement object modeling.

FIG. 1 illustrates some example systems that can be utilized to implement object modeling arranged in accordance with at least some embodiments described herein. In some examples, a system 100 may include an object 106, a processor 108, a memory 130 and/or a display 104 all in communication through one or more networks 118. As discussed in more detail below, in some examples, object 106 may be thrown by a user 102, as illustrated by a path 132, near an object 114 and/or an object 116. In some examples, object 106 may be configured to calculate image data 112 relating to objects 114, 116. Object 106 may be configured to send image data 112 to processor 108. Processor 108, based on instructions 132 in memory 130, may be configured to process image data 112 and generate a model 138 of object 114 and/or object 116. Model 138 may be stored in memory 130 and/or displayed as an image 110 on a display 104.

Figure 2:
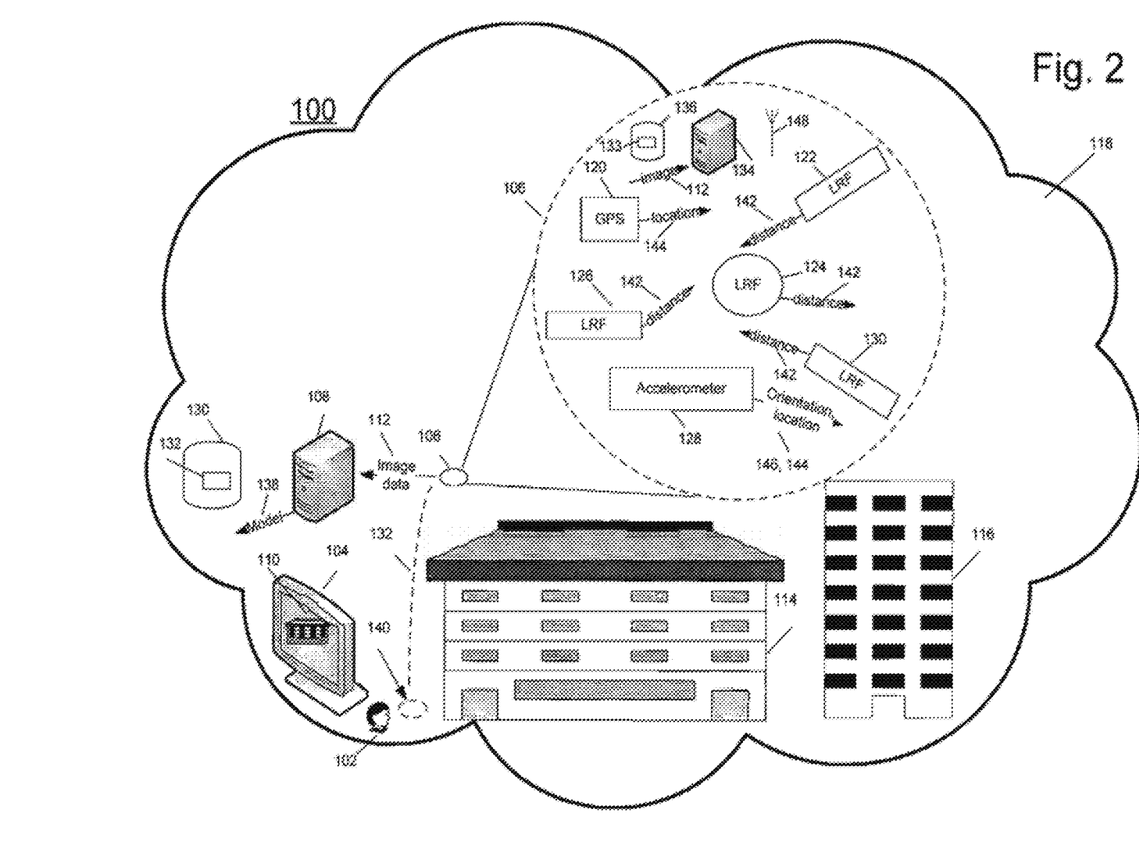
FIG. 2 illustrates some example systems that can be utilized to implement object modeling.

FIG. 2 illustrates some example systems that can be utilized to implement object modeling arranged in accordance with at least some embodiments described herein. The system of FIG. 2 is substantially similar to system 100 of FIG. 1, with additional details. Those components in FIG. 2 that are labeled identically to components of FIG. 1 will not be described again for the purposes of clarity.

In some examples, object 106 may generally be in the shape of a sphere, such as a ball, though any three dimensional object could be used. In an example, object 106 could be shaped and sized so that user 102 can throw object 106 with one hand. In some examples, object 106 may include at least one laser rangefinder 122, 124, 126, 130, an accelerometer 128, a global positioning system module 120, a processor 134 and/or a memory 136 all in communication. In an example, four laser rangefinders 122, 124, 126, 130 may be disposed in object 106 to form a tetrahedron.

As mentioned above, in some examples, object 106 may be thrown by user 102 through path 132. Object 106 may start at a starting point 140. In an example, at starting point 140, global positioning module 120 may be configured to calculate a location of starting point 140. For example, global positioning system 120 may be configured to calculate a latitude, longitude and height of starting point 140.

In an example, accelerometer 128 may be configured to calculate an orientation of object 106 at starting point 140. For example, accelerometer 128 may be configured to calculate a direction from where the Earth's gravitational force acts on object 106. In the example, accelerometer 128 further may be provided with locations of laser rangefinders 122, 124, 126, 130 disposed in object 106. Based on the location of laser rangefinders 122, 124, 126, 130 disposed in object 106 and the direction of the Earth's gravitational force, accelerometer 128 may be configured to calculate an initial orientation of object 106 at starting point 140. The initial orientation may be used to calculate respective lines of sight of laser rangefinders 122, 124, 126 and/or 130.

In some examples, when object 106 is thrown, accelerometer 128 may be configured to detect rotational movements of object 106. In some examples, based on the initial orientation and the detected rotational movements of object 106, accelerometer 128 may be configured to determine orientation data 146. Orientation data 146 may relate to an orientation of object 106 at any point along path 132 and may relate to respective lines of sight of laser rangefinders 122, 124, 126 and/or 130. Accelerometer 128 may be configured to send orientation data 146 to processor 134 and/or memory 136. In some examples, accelerometer 128 may be configured to determine location data 144 relating to a height of object 106 along path 132 based on a height at starting point 140 of object 106 and acceleration detected by accelerometer 128. In some examples, accelerometer 128 may be configured to send location data 144 to processor 134 and/or memory 136.

In some examples, global positioning system module 120 may be configured to calculate location data 144 relating to a location of object 106 at points along path 132. In some examples, location data 144 may include a latitude, longitude, and/or height of object 106 at points along path 132. In some examples, global positioning system module 120 may be configured to send location data 144 to processor 134 and/or memory 136.

In some examples, laser rangefinders 122, 124, 126, 130 may be configured to emit a laser beam along a line of sight and detect a reflection of the laser beam from points in objects 114, 116. Based on the reflections, laser rangefinders 122, 124, 126, 130 may be configured to determine distance data 142 relating to a distance between object 106 and points in objects 114, 116 capable of reflecting the laser beam. In some examples, laser rangefinders 122, 124, 126, 130 may be configured to determine distance data 142 at points along path 132. In some examples, laser rangefinders 122, 124, 126 and/or 130 may be configured to determine distance data 142 for distances below a defined threshold. For example, object 106 may be configured to determine distance data 142 for objects located less than the threshold distance from object 106.

In some examples, processor 134 and/or memory 136 may be configured to receive image data 112 including distance data 142, location data 144 and/or orientation data 146. In some examples, processor 108 may be configured to receive image data 112 from processor 134 and/or memory 136. In an example, processor 108 may be configured to retrieve image data 112 stored in memory 136. In an example, processor 134 may be configured to transmit image data 112 to processor 108 such as through antenna 148 and/or by WI-FI or other wireless communication.

In some examples, processor 108 or processor 134 may be configured to calculate respective a lines of sight of laser rangefinders 122, 124, 126, 130 based on orientation data 146. In an example, processor 108 and/or processor 134 may be configured to process image data 112 to generate model 138. For example, processor 108 or processor 134 may be configured to use instructions 132 in memory 130 or instructions 133 in memory 136 to process image data 112 to generate model 138. Image data 112 may represent a cloud of digitized three-dimension points in object 114 or 116. Processor 108 or processor 134 may be configured to use these digitized points to calculate or estimate surfaces or curves of object 114 or 116. Model 138 may then be generated based on these surfaces or curves.

In some examples, as object 106 moves through path 132, object 106 may move translationally and rotationally with respect to objects 114, 116. During this movement, lines of sight of laser rangefinders 122, 124, 126 and/or 130 may change. The laser rangefinders may receive reflections and calculate distance data 142 from multiple points in objects 114, 116. In some examples, processor 108 or processor 134 may be configured to calculate a sparse image data point cloud, with relatively few image data points, for objects 114, 116 for each throw of object 106. Multiple throws may be used to increase a density of the point cloud which may increase an accuracy of model 138.

Among other possible benefits, a system in accordance with this disclosure may be used to generate a model of a building. The system may be used even in situations where modeling would otherwise be difficult such as in a battlefield or where large equipment used to scan tall buildings may not be easily accessible. A system in accordance with the disclosure may provide a quick, easy and/or portable method to calculate an image data point cloud of an object. The cloud may be used to generate an object model. Objects that may be difficult to model using other methods, such as a roof, or that are difficult to directly see by a user, can be modeled using the described system.

Figure 3:
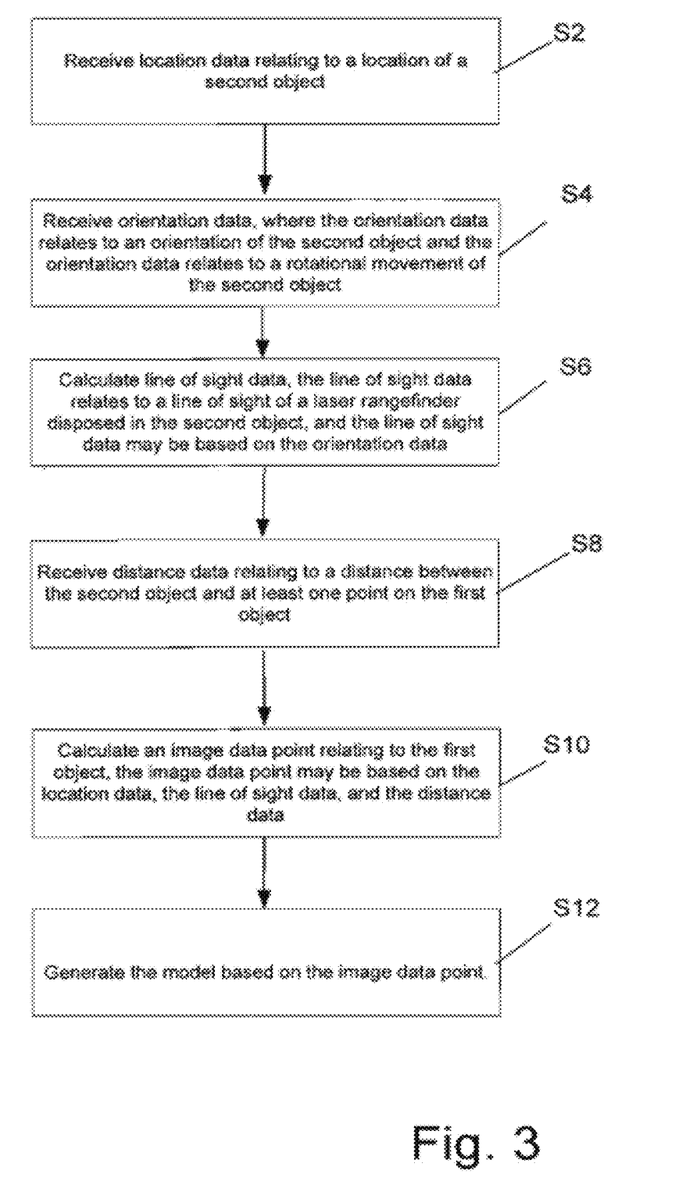
FIG. 3 depicts a flow diagram for example processes for implementing object modeling.

FIG. 3 depicts a flow diagram for example processes for implementing object modeling in accordance with at least some embodiments described herein. The process in FIG. 3 could be implemented using, for example, system 100 discussed above. An example process may include one or more operations, actions, or functions as illustrated by one or more of blocks S2, S4, S6, S8, S10 and/or S12. Although illustrated as discrete blocks, various blocks may be divided into additional blocks, combined into fewer blocks, or eliminated, depending on the desired implementation. Processing may begin at block S2.

At block S2, to model a first object, a processor may be configured to receive location data relating to a location of a second object. Block S2 can be followed by block S4.

At block S4, the processor may be configured to receive orientation data. In some examples, the orientation data relates to an orientation of the second object and the orientation data relates to a rotational movement of the second object. Block S4 can be followed by block S6.

At block S6, the processor may be configured to calculate line of sight data. In some examples, the line of sight data relates to a line of sight of a laser rangefinder disposed in the second object. In some examples, the line of sight data may be based on the orientation data. Block S6 can be followed by block S8.

At block S8, the processor may be configured to receive distance data relating to a distance between the second object and at least one point on the first object. Block S8 can be followed by block S10.

At block S10, the processor may be configured to calculate an image data point relating to the first object. In some examples, the image data point may be based on the location data, the line of sight data, and the distance data. Block S10 can be followed by block S12. At block S12, the processor may be configured to generate the model based on the image data point.

Figure 4:
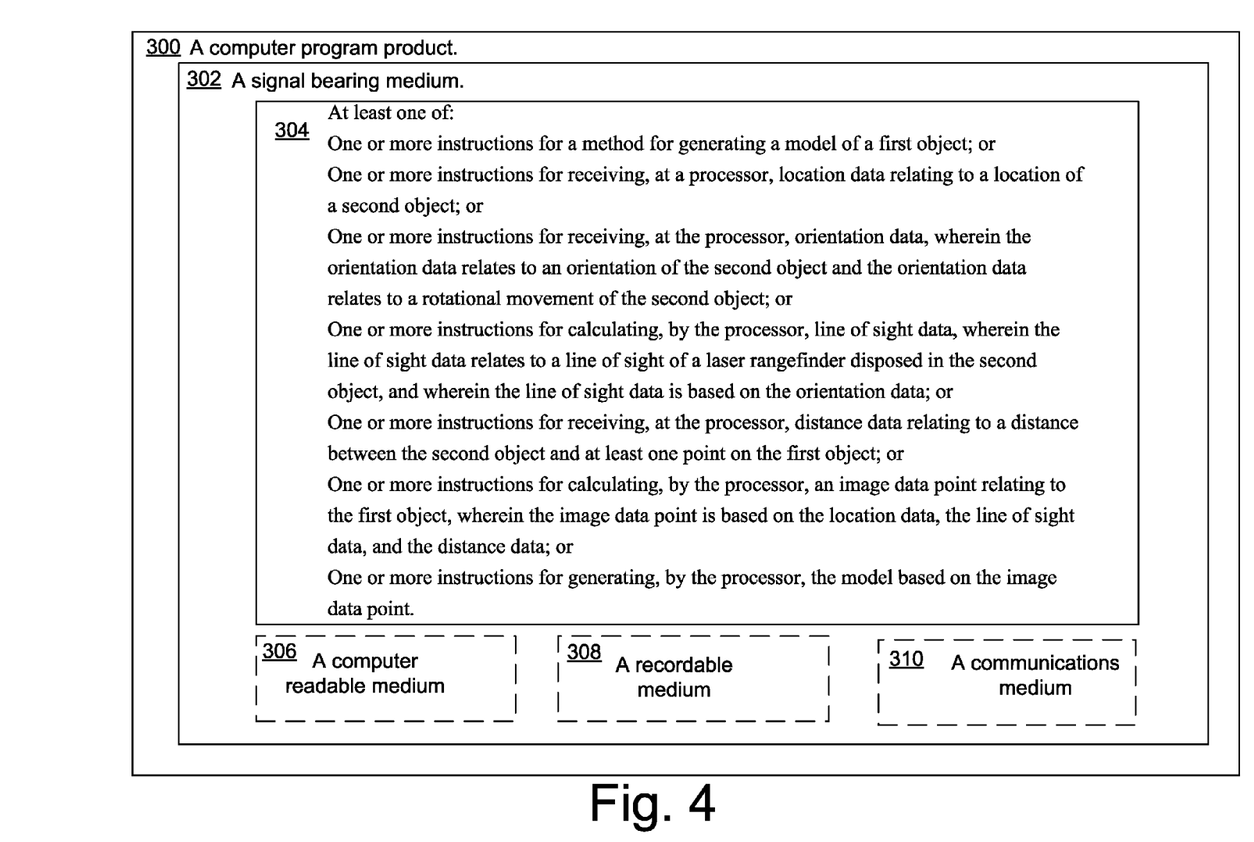
FIG. 4 illustrates computer program products for implementing object modeling.

FIG. 4 illustrates computer program products for implementing object modeling arranged according to at least some embodiments described herein. Program product 300 may include a signal bearing medium 302. Signal bearing medium 302 may include one or more instructions 304 that, when executed by, for example, a processor, may provide the functionality described above with respect to FIGS. 1-3. Thus, for example, referring to system 100, one or more of processors 134 and/or 108 may undertake one or more of the blocks shown in FIG. 4 in response to instructions 304 conveyed to the system 100 by medium 302.

In some implementations, signal bearing medium 302 may encompass a computer-readable medium 306, such as, but not limited to, a hard disk drive, a Compact Disc (CD), a Digital Versatile Disk (DVD), a digital tape, memory, etc. In some implementations, signal bearing medium 302 may encompass a recordable medium 308, such as, but not limited to, memory, read/write (R/W) CDs, R/W DVDs, etc. In some implementations, signal bearing medium 302 may encompass a communications medium 310, such as, but not limited to, a digital and/or an analog communication medium (e.g., a fiber optic cable, a waveguide, a wired communications link, a wireless communication link, etc.). Thus, for example, program product 300 may be conveyed to one or more modules of the system 100 by an RF signal bearing medium 302, where the signal bearing medium 302 is conveyed by a wireless communications medium 310 (e.g., a wireless communications medium conforming with the IEEE 802.11 standard).

Figure 5:
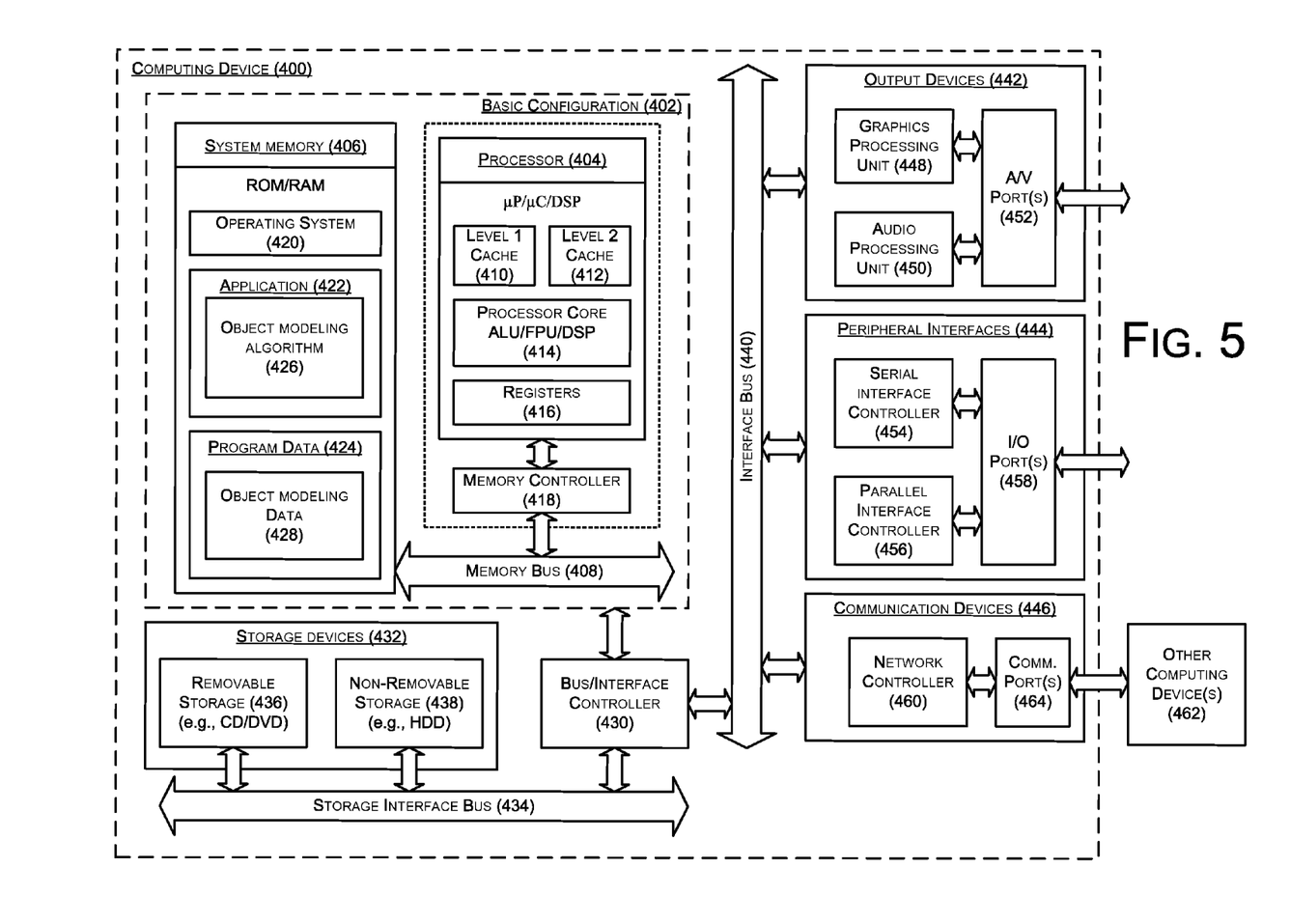
FIG. 5 is a block diagram illustrating an example computing device that is arranged to perform object modeling.

FIG. 5 is a block diagram illustrating an example computing device that is arranged to implement object modeling arranged according to at least some embodiments described herein. In a very basic configuration 402, computing device 400 typically includes one or more processors 404 and a system memory 406. A memory bus 408 may be used for communicating between processor 404 and system memory 406.

Depending on the desired configuration, processor 404 may be of any type including but not limited to a microprocessor ($\mu$P), a microcontroller ($\mu$C), a digital signal processor (DSP), or any combination thereof. Processor 404 may include one more levels of caching, such as a level one cache 410 and a level two cache 412, a processor core 414, and registers 416. An example processor core 414 may include an arithmetic logic unit (ALU), a floating point unit (FPLT), a digital signal processing core (DSP Core), or any combination thereof. An example memory controller 418 may also be used with processor 404, or in some implementations memory controller 418 may be an internal part of processor 404.

Depending on the desired configuration, system memory 406 may be of any type including but not limited to volatile memory (such as RAM), non-volatile memory (such as ROM, flash memory, etc.) or any combination thereof. System memory 406 may include an operating system 420, one or more applications 422, and program data 424.

Application 422 may include an object modeling algorithm 426 that is arranged to perform the functions as described herein including those described previously with respect to FIGS. 1-4. Program data 424 may include object modeling data 428 that may be useful for modeling objects as is described herein. In some embodiments, application 422 may be arranged to operate with program data 424 on operating system 420 such that modeling of objects may be provided. This described basic configuration 402 is illustrated in FIG. 5 by those components within the inner dashed line.

Computing device 400 may have additional features or functionality, and additional interfaces to facilitate communications between basic configuration 402 and any required devices and interfaces. For example, a bus/interface controller 430 may be used to facilitate communications between basic configuration 402 and one or more data storage devices 432 via a storage interface bus 434. Data storage devices 432 may be removable storage devices 436, non-removable storage devices 438, or a combination thereof. Examples of removable storage and non-removable storage devices include magnetic disk devices such as flexible disk drives and hard-disk drives (HDD), optical disc drives such as compact disc (CD) drives or digital versatile disc (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 406, removable storage devices 436 and non-removable storage devices 438 are examples of computer storage media. Computer storage media includes, but is not limited to, RAM, ROM, EEPROM, flash memory or other memory technology, CD-ROM, digital versatile discs (DVDs) or other optical storage, magnetic cassettes, magnetic tape, magnetic disk storage or other magnetic storage devices, or any other medium which may be used to store the desired information and which may be accessed by computing device 400. Any such computer storage media may be part of computing device 400.

Computing device 400 may also include an interface bus 440 for facilitating communication from various interface devices (e.g., output devices 442, peripheral interfaces 444, and communication devices 446) to basic configuration 402 via bus/interface controller 430. Example output devices 442 include a graphics processing unit 448 and an audio processing unit 450, which may be configured to communicate to various external devices such as a display or speakers via one or more A/V ports 452. Example peripheral interfaces 444 include a serial interface controller 454 or a parallel interface controller 456, which may be configured to communicate with external devices such as input devices (e.g., keyboard, mouse, pen, voice input device, touch input device, etc.) or other peripheral devices (e.g., printer, scanner, etc.) via one or more I/O ports 458. An example communication device 446 includes a network controller 460, which may be arranged to facilitate communications with one or more other computing devices 462 over a network communication link via one or more communication ports 464.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 400 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 400 may also be implemented as a personal computer including both laptop computer and non-laptop computer configurations.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method to generate a model of a first object, the method comprising:
   receiving, at a processor, location data relating to a location of a second object different from the first object, the second object effective to move translationally and rotationally with respect to the first object and effective to move along a path, wherein the path includes a first point and a second point, the location data including a height of the second object along the path;
   receiving, at the processor, orientation data, wherein the orientation data relates to an orientation of the second object, the orientation data relates to a gravitational force acting on the second object during the movement of the second object along the path, the orientation data relates to a rotational movement of the second object along the path, and the orientation data relates to a first location in the second object of a first laser rangefinder disposed in the second object, the orientation data relates to a second location in the second object of a second laser rangefinder disposed in the second object, wherein during the movement of the second object along the path, the first laser rangefinder is effective to emit a first laser beam, and the second rangefinder is effective to emit a second laser beam;
   calculating, by the processor, first line of sight data, wherein the first line of sight data relates to a first line of sight of the first laser rangefinder disposed in the second object, the first line of sight being associated with a first direction when the second object is at the first point along the path, such that the first laser rangefinder detects a first reflection of the first laser beam from the first object when the second object is at the first point along the path, where a first distance between the second object and the first object is based on the first reflection of the first laser beam detected by the first laser rangefinder when the second object is at the first point along the path, the first line of sight being associated with a second direction when the second object is at the second point along the path such that the first laser rangefinder emits the first laser beam along the second direction when the second object is at the second point along the path, the second direction being different from the first direction, when the second object is at the second point along the path, and wherein the first line of sight data is based on the orientation data;
   calculating, by the processor, second line of sight data, wherein the second line of sight data relates to a second line of sight of the second laser rangefinder disposed in the second object, the second line of sight being associated with a third direction when the second object is at the first point along the path such that the second laser rangefinder emits the second laser beam along the third direction when the second object is at the first point along the path, the second line of sight being associated with a fourth direction when the second object is at the second point along the path such that the second laser rangefinder detects a second reflection of the second laser beam from the first object when the second object is at the second point along the path, where a second distance between the second object and the first object is based on the second reflection of the second laser beam detected by the second laser rangefinder when the second object is at the second point along the path, the second line of sight is different from the first line of sight, the second line of sight data is based on the orientation data, and the second line of sight data is different from the first line of sight data;
   receiving, at the processor, distance data relating to the first and second distances;
   calculating, by the processor, an image data point relating to the first object, wherein the image data point is based on the location data, the first line of sight data, the second line of sight data, and the distance data; and
   generating, by the processor, the model of the first object based on the image data point.

2. The method as recited in claim 1, wherein the distance data is received by the processor from the first and second laser rangefinders.

3. The method as recited in claim 1, wherein the location data includes a longitude of the second object and a latitude of the second object.

4. The method as recited in claim 1, wherein the orientation data is received by the processor from an accelerometer disposed in the second object.

5. The method as recited in claim 1, wherein the location data is received by the processor from a global positioning system module disposed in the second object.

6. The method as recited in claim 1, further comprising receiving, by the processor, the orientation data after the second object has been thrown.

7. The method as recited in claim 6, further comprising:
   determining, by an accelerometer disposed in the second object, an initial orientation of the second object; and
   calculating the first and second line of sight data based on the initial orientation and the orientation data.

8. The method as recited in claim 7, further comprising: determining a starting location of the second object; and wherein calculating the image data point is based on the starting location.

9. The method as recited in claim 8, wherein the starting location includes a latitude, longitude and starting height of the second object.

10. The method of claim 1, wherein the orientation data further relates to a third location in the second object of a third laser rangefinder disposed in the second object, the method further comprising:
calculating, by the processor, third line of sight data, wherein:
the third line of sight data relates to a third line of sight of the third laser rangefinder disposed in the second object;
the third line of sight data is based on the orientation data;
the third line of sight data is different from the first and second line of sight data;
the third line of sight being associated with a fifth direction when the second object is at the first point along the path;
the third line of sight being associated with a sixth direction when the second object is at the second point along the path;
the third line of sight is different from the first and second lines of sight; and
the image data point is further based on the third line of sight data.

11. The method of claim 1, wherein the second object is in a shape of a sphere.

12. A system effective to generate a model of a first object, the system comprising:
a second object effective to move translationally and rotationally with respect to the first object and effective to move along a path, wherein the second object is different from the first object, and the path includes a first point and a second point;
a first laser rangefinder and a second laser rangefinder disposed in the second object, wherein during the movement of the second object along the path, the first laser rangefinder is effective to emit a first laser beam, and the second laser rangefinder is effective to emit a second laser beam; and
a processor;
wherein the second object is effective to:
calculate location data that relates to a location of the second object, the location data including a height of the second object along the path;
calculate orientation data that relates to an orientation of the second object, wherein the orientation data relates to a rotational movement of the second object along the path, the orientation data relates to a gravitational force effective to act on the second object during the movement of the second object along the path, the orientation data relates to a first location in the second object of the first laser rangefinder, and the orientation data relates to a second location in the second object of the second laser rangefinder; and
calculate distance data that relates to a first distance and a second distance between the second object and at least one point on the first object;
wherein the processor is effective to:
receive the location data, the orientation data, and the distance data;
calculate first line of site data that relates to a first line of sight of the first laser rangefinder disposed in the second object, the first line of sight being associated with a first direction when the second object is at the first point along the path, such that the first laser rangefinder detects a first reflection of the first laser beam from the first object when the second object is at the first point along the path, where the first distance is based on the first reflection of the first laser beam detected by the first laser rangefinder when the second object is at the first point along the path, the first line of sight being associated with a second direction when the second object is at the second point along the path such that the first laser rangefinder emits the first laser beam along the second direction when the second object is at the second point along the path, the second direction being different from the first direction, when the second object is at the second point along the path, wherein the first line of sight data is based on the orientation data;
calculate second line of site data that relates to a second line of sight of the second laser rangefinder disposed in the second object, the second line of sight is different from the first line of sight, the second line of sight being associated with a third direction when the second object is at the first point along the path such that the second laser rangefinder emits the second laser beam along the third direction when the second object is at the first point along the path, the second line of sight being associated with a fourth direction when the second object is at the second point along the path such that the second laser rangefinder detects a second reflection of the second laser beam from the first object when the second object is at the second point along the path, where the second distance is based on the second reflection of the second laser beam detected by the second laser rangefinder when the second object is at the second point along the path, the second line of sight data is based on the orientation data, and the second line of sight data is different from the first line of sight data;
calculate an image data point of the first object based on the location data, the first line of sight data, the second line of sight data, and the distance data; and
generate the model of the first object based on the image data point.

13. The system as recited in claim 12, wherein the processor is disposed external to the second object.

14. The system as recited in claim 12, wherein the first and second laser rangefinders are effective to calculate the distance data.

15. The system as recited in claim 12, wherein the location data includes a longitude of the second object and a latitude of the second object.

16. The system as recited in claim 12, wherein the second object further comprises an accelerometer, and wherein the accelerometer is effective to calculate the orientation data.

17. The system as recited in claim 16, wherein:
the accelerometer is effective to calculate an initial orientation of the second object; and
the processor is effective to calculate the first and second line of sight data based on the initial orientation and the orientation data.

18. The system as recited in claim 12, wherein the second object further comprises a global positioning system module, and wherein the global positioning system module is effective to calculate the location data.

19. The system as recited in claim 18, wherein the global positioning system module is further effective to
   determine a starting location of the second object; and
   wherein the processor is effective to calculate the image data point based on the starting location.

20. The system as recited in claim 19, wherein the starting location includes a latitude, longitude and starting height of the second object.

21. A first object effective to calculate image data that relates to a second object different from the first object, the first object effective to move translationally and rotationally with respect to the second object and effective to move along a path, the first object comprising:
   a global positioning system module, wherein the global positioning system module is effective to calculate location data that relates to a location of the first object, the location data including a height of the first object along the path, wherein the path includes a first point and a second point;
   a first laser rangefinder and a second laser rangefinder, wherein during the movement of the first object along the path, the first laser rangefinder is effective to emit a first laser beam, and the second laser rangefinder is effective to emit a second laser beam, the first and second laser rangefinders are effective to calculate distance data that relates to a first distance and a second distance between the first object and at least one point on the second object;
   an accelerometer, wherein the accelerometer is effective to calculate orientation data, wherein the orientation data relates to:
      an orientation of the first object,
      a gravitational force effective to act on the second object during the movement of the second object along the path,
      a first line of sight of the first laser rangefinder, the first line of sight being associated with a first direction when the first object is at the first point along the path, such that the first laser rangefinder detects a first reflection of the first laser beam from the second object when the first object is at the first point along the path, where the first distance is based on the first reflection of the first laser beam detected by the first laser rangefinder when the first object is at the first point along the path, the first line of sight being associated with a second direction when the first object is at the second point along the path such that the first laser rangefinder emits the first laser beam in the second direction when the first object is at the second point along the path, the second direction being different from the first direction, when the first object is at the second point along the path,
      a second line of sight of the second laser rangefinder, the second line of sight being associated with a third direction when the first object is at the first point along the path such that the second laser rangefinder emits the second laser beam along the third direction when the first object is at the first point along the path, the second line of sight being associated with a fourth direction when the first object is at the second point along the path such that the second laser rangefinder detects the second reflection of the second laser beam from the second object when the first object is at the second point along the path, where the second distance is based on the second reflection of the second laser beam detected by the second laser rangefinder when the first object is at the second point along the path, wherein the second line of sight is different from the first line of sight,
      a first location in the first object of the first laser rangefinder,
      a second location in the first object of the second laser rangefinder,
      and a rotational movement of the first object along the path;
   a memory in communication with the global positioning system module, the laser rangefinder, and the accelerometer, wherein the memory is effective to receive and store the location data, the distance data, and the orientation data;
   a processor in communication with the memory, wherein the processor is effective to:
      receive the first and second location data, the orientation data, and the first and second distance data; and
      calculate first line of site data that relates to the first line of sight of the first laser rangefinder, wherein the first line of sight data is based on the orientation data;
      calculate second line of site data that relates to the second line of sight of the second laser rangefinder, wherein the second line of sight data is based on the orientation data:
      calculate an image data point of the second object based on the location data, the first and second line of sight data, and the distance data; and
      generate a model of the second object based on the image data point.

* * * * *